(12) United States Patent
Gore et al.

(10) Patent No.: US 7,210,110 B2
(45) Date of Patent: *Apr. 24, 2007

(54) METHOD FOR DETERMINING A MATCHED ROUTING ARRANGEMENT FOR SEMICONDUCTOR DEVICES

(75) Inventors: Brooklin J. Gore, Boise, ID (US); Michael D. Lee, Boise, ID (US); Matthew L. Priest, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 257 days.

This patent is subject to a terminal disclaimer.

(21) Appl. No.: 10/926,573

(22) Filed: Aug. 25, 2004

(65) Prior Publication Data

US 2005/0050508 A1     Mar. 3, 2005

Related U.S. Application Data

(63) Continuation of application No. 10/233,286, filed on Aug. 28, 2002, now Pat. No. 6,789,233.

(51) Int. Cl.
*G00F 17/50* (2006.01)
(52) U.S. Cl. .................... 716/5; 716/2; 716/12
(58) Field of Classification Search ............. 716/1–18
See application file for complete search history.

(56) References Cited

U.S. PATENT DOCUMENTS

| | | | | |
|---|---|---|---|---|
| 4,935,877 A | * | 6/1990 | Koza | 706/13 |
| 5,136,513 A | * | 8/1992 | Sol et al. | 701/124 |
| 5,239,643 A | * | 8/1993 | Blount et al. | 707/102 |
| 5,329,464 A | * | 7/1994 | Sumic et al. | 703/1 |
| 5,343,554 A | * | 8/1994 | Koza et al. | 706/13 |
| 5,535,134 A | * | 7/1996 | Cohn et al. | 716/8 |
| 5,550,839 A | * | 8/1996 | Buch et al. | 714/724 |
| 5,651,099 A | * | 7/1997 | Konsella | 706/13 |
| 5,742,738 A | * | 4/1998 | Koza et al. | 706/13 |
| 5,867,397 A | * | 2/1999 | Koza et al. | 703/14 |
| 6,226,776 B1 | | 5/2001 | Panchul et al. | 716/3 |
| 6,292,929 B2 | | 9/2001 | Scepanovic et al. | 716/14 |
| 6,424,959 B1 | * | 7/2002 | Bennett et al. | 706/13 |
| 6,493,658 B1 | * | 12/2002 | Koford et al. | 703/1 |
| 6,578,176 B1 | | 6/2003 | Wang et al. | 716/2 |
| 6,711,720 B2 | | 3/2004 | Chen | 716/2 |
| 6,785,662 B1 | * | 8/2004 | Guy et al. | 706/13 |
| 6,789,233 B2 | | 9/2004 | Gore et al. | 716/2 |

OTHER PUBLICATIONS

Christensen, Heather L., Roger L. Wainwright, and Dale A. Schoenefeld. "A Hybrid Algorithm For The Point To Multipoint Routing Problem." ACM 1997: 263-268.

(Continued)

*Primary Examiner*—Vuthe Siek
(74) *Attorney, Agent, or Firm*—Dorsey & whitney LLP

(57) ABSTRACT

The present invention relates to a method for determining a matched routing netlist for a semiconductor device. In a particular embodiment, a topological plan for the microelectronic device is compiled and used to calculate a population of netlists. The netlists are then dynamically modified using a genetic algorithm to generate a matched netlist for the device.

26 Claims, 10 Drawing Sheets

OTHER PUBLICATIONS

Davidenko, Vladimir N., Victor M. Kureichik, and Victor V. Miagkikh. "Genetic Algorithm For Restrictive Channel Routing Problem." 1997.

Esbensen, Henrik, and Ernest S. Kuh. "A Performance-Driven IC/MCM Placement Algorithm Featuring Explicit Design Space Exploration." *ACM Transactions on Design Automation of Electronic Systems*, vol. 2, No. 1, Jan. 1997: 62-80.

Goni, B. M., T. Arslan, and B. Turton. "A Genetic Algorithm For Over-The-Cell and Channel Area Optimization." Proceedings of the 2000 Congress on Evolutionary Computation, Jul. 16-19, 2000. La Jolla, California: 586-592.

Kahng, Andrew B., and Chung-Wen Albert Tsao. "Practical Bounded-Skew Clock Routing." 1-25, no date.

Koza, J. R., F. H. Bennett III, D. Andre, and M. A. Keane. "Synthesis of topology and sizing of analog electrical circuits by means of genetic programming." Computer Methods in Applied Mechanics and Engineering. 186, 2000: 459-482.

Mostafa, Mohamed E., and Saad M. A. Eid. "A Genetic Algorithm for Joint Optimization of Capacity and Flow Assignment in Packet Switched Networks." Seventeenth National Radio Science Conference, Feb. 22-24, 2000, Minufiya University, Egypt: C5 1-C5 6.

Munetomo, Masaharu, Yoshiaki Takai, and Yoshiharu Sato. "An Adaptive Network Routing Algorithm Employing Path Genetic Operators," no date.

Sinha, K., S. Sur-Kolay, P.S. Dasgupta, and B. B. Bhattacharya. "Partitioning Routing Area into Zones with Distinct Pins." IEEE, 2000: 345-350.

Skok, Minea, Davor Škrlec, and Slavko Krajcar. "The Non-Fixed Destination Multiple Depot Capacitated Vehicle Routing Problem and Genetic Algorithms." Twenty-Second International Conference Information Technology Interfaces ITI, Jun. 13-16, 2000, Pula, Croatia.

Tan, K. C., L. H. Lee, and K. Q. Zhu. "Heuristic Methods for Vehicle Routing Problem with Time Windows." Sep. 10, 1999: 1-34.

Tan, K. C., T. H. Lee, K. Ou, and L. H. Lee. "A Messy Genetic Algorithm for the Vehicle Routing Problem with Time Window Constraints." Proceedings of the 2001 Congress on Evolutionary Computation. May 27-30, 2001, COEX, Seoul, Korea: 679-686.

Tang, Maolin, Kamran Eshraghian, and Daryoush Habibi. "Knowledge-based Genetic Algorithm for Layer Assignment." IEEE, 2001: 184-190.

Tang, Maolin, Kamran Eshraghian, and Hon Nin Cheung. "A Genetic Algorithm For Constrained VIA Minimization." IEEE 1999: 435-440.

Zhou, Xianwei, Chen Changjia, and Zhu Gang. "A Genetic Algorithm for Multicasting Routing Problem," no date.

Zhu, Kenny Qili. "A New Genetic Algorithm For VRPTW." National University of Singapore, Apr. 13, 2000: 1-10.

Zhu, Liming, Roger L. Wainwright, and Dale A. Schoenefeld. "A Genetic Algorithm for the Point to Multipoint Routing Problem with Varying Number of Requests." IEEE 1998: 171-176.

* cited by examiner

| CHANNEL | CAPACITY | WEIGHT | LAYER |
|---|---|---|---|
| 0 | 0 | 0 | 0 |
| 1 | 3 | 3 | 1 |
| 2 | 3 | 1 | 1 |
| 3 | 3 | 2 | 1 |
| 4 | 3 | 3 | 1 |
| 5 | 3 | 2 | 2 |
| 6 | 3 | 2 | 2 |
| 7 | 3 | 1 | 2 |
| 8 | 3 | 9 | 2 |
| 9 | 3 | 3 | 2 |
| 10 | 3 | 1 | 2 |
| 11 | 3 | 1 | 2 |
| 12 | 3 | 1 | 1 |
| 13 | 3 | 2 | 1 |
| 14 | 3 | 1 | 2 |
| 15 | 3 | 1 | 2 |
| 16 | 3 | 2 | 2 |
| 17 | 3 | 2 | 2 |
| 18 | 3 | 2 | 2 |
| 19 | 3 | 3 | 1 |
| 20 | 3 | 4 | 1 |
| 21 | 3 | 3 | 1 |

FIG.5

| SOURCE PIN | DRAIN PIN | GROUP |
|---|---|---|
| 4' | 1' | 0 |
| 4' | 8' | 0 |
| 0' | 2' | 1 |
| 0' | 3' | 1 |
| 5' | 6' | 1 |
| 5' | 7' | 1 |

FIG.6

| ROUTE | (FITNESS=59.5) | | ROUTE | (FITNESS=57.5) |
|---|---|---|---|---|
| 0 | (4', 23", 20", 1') | | 0 | (4', 23", 14", 23", 20", 1') |
| 1 | (4', 23", 14", 27", 8') | | 1 | (4', 23", 14", 27", 8') |
| 2 | (0', 19", 10", 9", 21", 2') | | 2 | (0', 19", 10", 9", 21", 2') |
| 3 | (0', 19", 10", 22", 13", 22", 3') | | 3 | (0', 19", 10", 22", 13", 22", 3') |
| 4 | (5', 24", 13", 26", 16", 15", 25", 6') | | 4 | (5', 24", 13", 26", 16", 15", 25", 6') |
| 5 | (5', 24", 13", 26", 7') | | 5 | (5', 24", 13", 26", 7') |

P₁ → C₁ x

| ROUTE | (FITNESS=71.5) | | ROUTE | (FITNESS=73.5) |
|---|---|---|---|---|
| 0 | (4', 23", 14", 23", 20", 1') | | 0 | (4', 23", 20", 1') |
| 1 | (4', 23", 14", 27", 8') | | 1 | (4', 23", 14", 27", 8') |
| 2 | (0', 19", 10", 9", 21", 2') | | 2 | (0', 19", 10", 9", 21", 2') |
| 3 | (0', 19", 10", 22", 3') | | 3 | (0', 19", 10", 22", 3') |
| 4 | (5', 24", 13", 26", 16", 15", 25", 6') | | 4 | (5', 24", 13", 26", 16", 15", 25", 6') |
| 5 | (5', 24", 13", 26", 7') | | 5 | (5', 24", 13", 26", 7') |

| FITNESS ↓ | POPULATION SIZE | | |
|---|---|---|---|
| | 25 | 50 | 100 |
| 38.5 | 7% | 28% | 34% |
| 40.5 | 21% | 45% | 56% |
| 42.5 | 78% | 89% | 99% |
| 43.5-48.5 | 100% | 100% | 100% |
| COMPUTATION TIME → | 0.17s | 0.51s | 1.05s |

FIG.11

METHOD FOR DETERMINING A MATCHED ROUTING ARRANGEMENT FOR SEMICONDUCTOR DEVICES

CROSS-REFERENCE TO RELATED APPLICATION

This application is a continuation of U.S. patent application Ser. No. 10/233,286, filed Aug. 28, 2002, now U.S. Pat. No. 6,789,233.

TECHNICAL FIELD

The present invention relates to a method for determining a matched routing arrangement for a semiconductor device. More particularly, the invention is directed to a computational method using a genetic algorithm to determine a matched routing arrangement.

BACKGROUND OF THE INVENTION

The significant advances in computer technology and in electronics in general is due in large part to the development of microelectronic devices of increasing density and smaller scale. The smaller and more complex semiconductor circuits formed within the microelectronic device generally include discrete elements such as resistors, capacitors, diodes and transistors that are organized into separate cells to perform a specified function. Each of the cells in the microelectronic device may have one or more pins, which may be coupled to one or more pins on another cell by wires extending between the pins. In the discussion that follows, pins are understood to refer to contacts, or coupling points for the wires. The wires coupling the cells are generally formed in a layer of the device that contains the cells. A net is a set of two or more pins that must be coupled by wires. In many cases, a net includes only a pair of pins that require coupling. In some cases, however, the net may include three or more pins that must be coupled. A list of nets for the microelectronic device is commonly referred to as a netlist.

The lengths of the nets that couple the pins is a critical factor in the design of microelectronic devices, since the propagation of a signal along an interconnecting net requires a finite length of time. Generally, when the net layout is designed, a significant effort is made to minimize the lengths of the nets. As the scale of microelectronic devices continues to decrease, however, the relative delays in signal propagation incurred by nets of unequal length has become a significant factor affecting the performance of these devices, which is not adequately addressed by minimizing the lengths of the nets.

A determination of the net lengths extending between the pins to achieve either a shortest net length solution, or alternatively, to match the net lengths, may be performed in a variety of ways, including a simple hand calculation of the routing or other approximate methods that may be implemented during the net layout stage. In general, however, the determination of either the minimum net length solution, or the determination of a matched net length solution for a microelectronic device is a complex multivariable optimization problem that is best suited for solution using a computer, which can select optimum net lengths based upon repeated calculations of actual net lengths. If the number of pins becomes large, however, the foregoing "brute force" solution method becomes increasingly intractable. For example, in calculating the net lengths in a minimum net length solution that includes N different pins, testing every possible combination is estimated to require on the order of about N! additions. For a problem having only nine pins, and assuming an arithmetic speed of 1 billion additions per second, an estimated computation time on the order of approximately about 0.4 milliseconds is required. If the number of pins is doubled to 18, however, the estimated calculation time is on the order of about 0.2 years. Still further, if only a single additional pin is included, the estimated calculation time dramatically increases to a time on the order of about 3800 years. Clearly, brute force calculation methods are incapable of handling optimization problems of this kind, unless the number of pins in the microelectronic device is of modest size.

One known method for solving complex multivariable optimization problems of the foregoing type is through the use of genetic algorithms. Genetic algorithms generally represent a class of algorithms that solve optimization problems by at least partially simulating the evolutionary processes of natural selection. Accordingly, favorable outcomes of an iterative computational scheme are combined with still other favorable outcomes to accelerate convergence to an optimum solution, while the less favorable solutions are discarded. Consequently, the number of discrete arithmetic operations is generally substantially reduced through the use of a genetic algorithm. Without regard to the exact nature of the optimization problem, a genetic algorithm generally proceeds through a series of steps, as described below.

A genetic algorithm procedure generally begins with an initialization step, wherein an initial population of solutions to the optimization problem is generated. The initial population may be obtained from other computational procedures, or it may consist of a series of solutions that are initial estimated solutions, or still further, the initial population may be randomly generated. Next, an evaluation is performed by applying a problem-specific evaluation function to the initial population of solutions. The evaluation function thus determines the relative acceptability of the solution. The evaluation of the initial population permits solutions to be selected as parents of the next generation of solutions. In order to advance the computation, the more favorable solutions may be selected as parents numerous times, while the less favorable solutions are not selected at all.

Each pair of parent solutions is subsequently combined through a crossover process that produces a pair of offspring that have similarities to both parents. The crossover process is central to the technique, since it allows the concentration of traits associated with an optimal solution to be manifested in a single individual. In addition, a mutation operator may be applied to either offspring. When a mutation operator is applied, some random change generally occurs to a randomly selected characteristic, so that the offspring solution is thus derived asexually. In general, most genetic algorithms utilize a combination of mutation and crossover to derive successive populations.

The offspring population is then evaluated by applying the evaluation function to each member of the offspring population. Since the offspring are modified forms of the parent population, at least some of the offspring are evaluated more favorably than the parent population from which they were derived. Further refinement may occur by combining the offspring population with the population that the parent population originated from, in order to recursively optimize the solution. Termination of the calculation can be based upon the achievement of predetermined convergence criteria, such as the difference of successive solutions differing by at most a predetermined value, or alternatively, when the average solution for the population has not changed within a predetermined number of iterations.

In general, no method currently exists to achieve a matched net length solution using a genetic algorithm procedure. Instead, layout designs having matched net lengths are generated by hand calculation or other approximate methods, which generally consider only a single net at a time. For detailed netlists, a considerable amount of time is generally required to determine net lengths, with the resultant nets being only reasonably well matched. Accordingly, there is a need in the art for a computational method that will permit net lengths to be better matched than current methods allow. Further, there is a need in the art for a computational technique that eliminates time consuming manual methods frequently utilized to provide approximate matched net lengths.

SUMMARY OF THE INVENTION

The present invention relates to a method for determining a matched routing netlist for a semiconductor device. In particular, the invention is directed to a computational method using a genetic algorithm to determine a matched netlist. In one aspect, a topological plan for the microelectronic device is compiled and used to calculate a population of netlists. The netlists are then dynamically modified using a genetic algorithm to generate a matched netlist for the device.

BRIEF DESCRIPTION OF THE DRAWINGS

FIG. 5 is a channel table corresponding to an exemplary microelectronic device.

FIG. 6 is a net table corresponding to an exemplary microelectronic device.

FIG. 8 is a diagram illustrating the results of a crossover corresponding to an exemplary microelectronic device.

FIG. 11 is a diagram illustrating the results of a computational performance evaluation to investigate the effect of different netlist population sizes.

DETAILED DESCRIPTION OF THE INVENTION

Many of the specific details of certain embodiments of the invention are set forth in the following description and in FIGS. 2 through 11 to provide a thorough understanding of such embodiments. One skilled in the art will understand, however, that the present invention may be practiced without several of the details described in the following description. Moreover, in the description that follows, it is understood that the figures related to the various embodiments are not to be interpreted as conveying any specific or relative physical dimensions, and that specific or relative physical dimensions, if stated, are not to be considered limiting unless the claims expressly state otherwise. Further, illustrations of the various embodiments when presented by way of illustrative examples, are intended only to further illustrate certain details of the various embodiments, and shall not be interpreted as limiting the scope of the invention.

Figure 1:
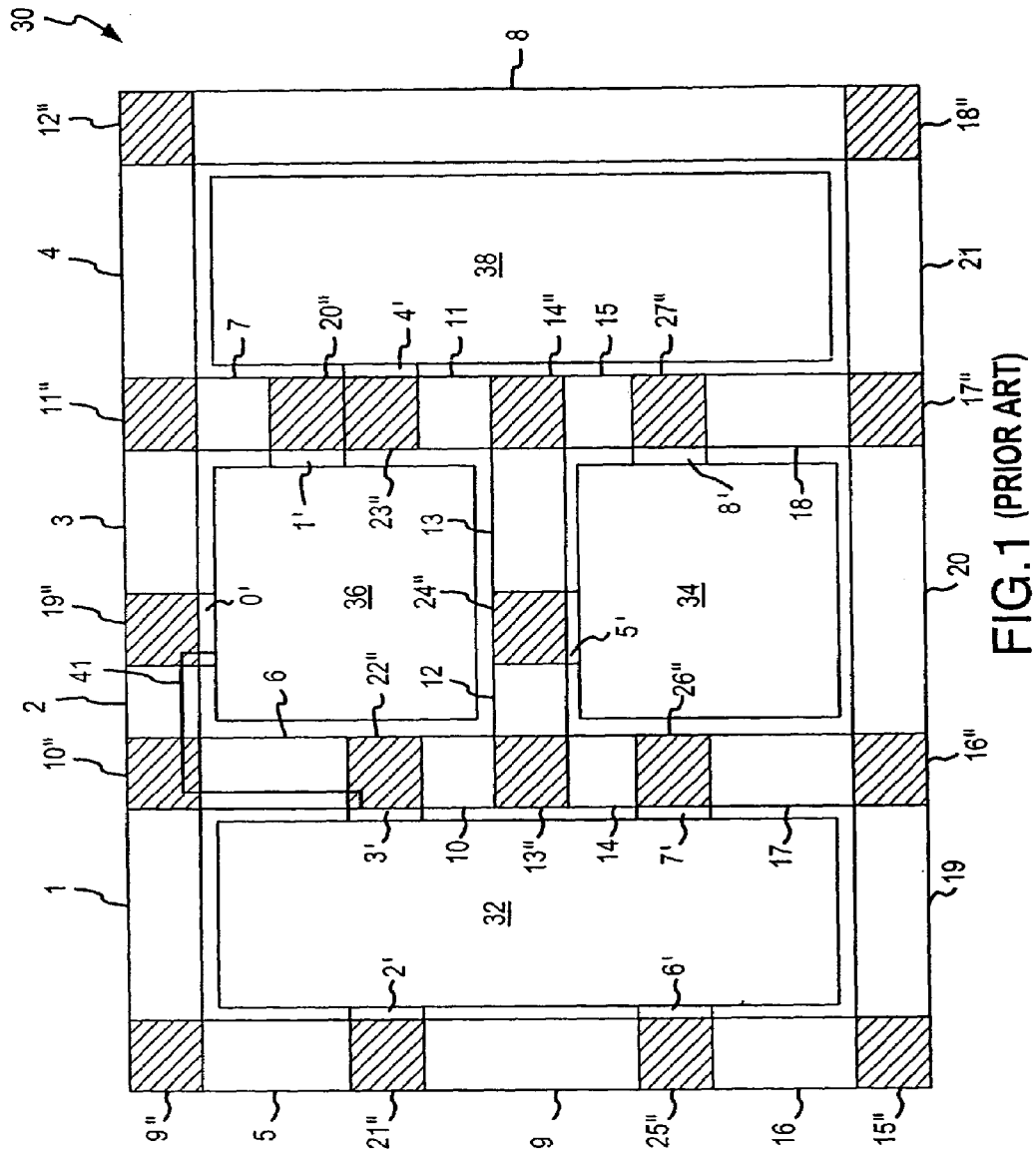
FIG. 1 is a partial plan view of an exemplary microelectronic device according to the prior art.

FIG. 1 is a partial plan view of an exemplary microelectronic device 30 that illustrates the topological features present in the device 30. The device 30 may include a single layer, as shown in FIG. 1, or it may include multiple layers that are superimposed within the device. In either case, the device 30 further includes cells 32–38 positioned on the one or more layers that include a plurality of discrete elements, such as resistors, capacitors, transistors, or still other discrete elements (not shown) that are monolithically formed in the one or more layers that are operatively coupled to perform predetermined functions. The device 30 further includes a plurality of channels 1–21 extending along portions of the device 30 in a two-dimensional pattern that permit the formation of wires 41 for interconnecting the cells 32–38. For clarity of illustration, only a single wire 41 is shown. It is understood, however, that the channels 1–21 may include more than a single wire 41, and that portions of the wires may be recursively routed within each of the channels 1–21. The cells 32–38 further include pins 0'–8' that extend outwardly from the cells 32–38. The pins 0'–8' are coupled to the channels 1–21 by vertices 1"–27", which also couple to portions of the channels 1–21. In the discussion that follows, the one or more pins associated with a cell will be denoted by a single prime applied to the element number, while the vertices will be denoted by a double prime applied to the element number.

Still referring to FIG. 1, the channels 1–21 have a variety of lengths that may be correlated to a delay time associated with the transmission of a signal along a wire 41 formed within a specified one of the channels 1–21. The channels 1–21 also have a finite width that generally restricts the number of wires 41 that may be formed within a specified one of the channels 1–21. As noted earlier, a significant challenge that confronts layout designers involves positioning wires 41 within the channels 1–21 that couple to selected pins 0'–8' of the cells 32–38 so that the selected wires 41 have matched lengths. In determining the matched lengths, the designer may vary the net routing between the pins 0'–8', the population of the wires 41 that are formed within a specified one of the channels 1–21, or other factors while endeavoring to maintain reasonably short net lengths for the device 30. Generally, the routing of the wires 41 (or nets) is determined by positioning a wire 41 within a selected one of the channels 1–21 that couples the selected cells 32–38, followed by the successive addition of other wires 41 to the channels 1–21.

Figure 2:
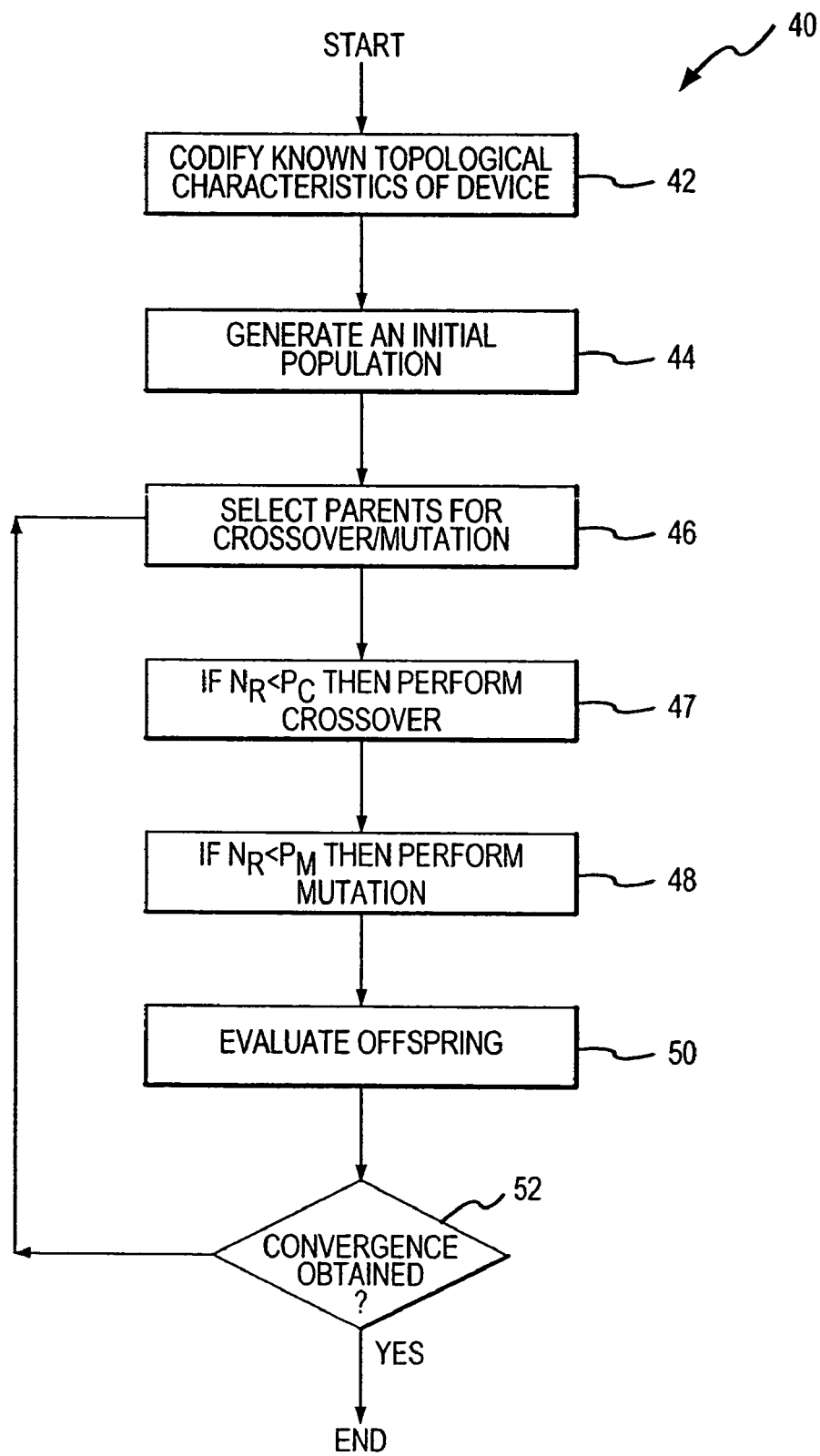
FIG. 2 is a flowchart illustrating the steps in a method for calculating a set of matched net lengths, according to an embodiment of the invention.

FIG. 2 is a flowchart illustrating the steps in a method 40 for calculating a set of matched net lengths in a microelectronic device, according to an embodiment of the invention. The method 40 utilizes a genetic algorithm procedure, as previously discussed. At step 42, the known topological characteristics of the device 30 are codified. The relevant characteristics include a complete description of the interconnections between the vertices 1"–27". The known topological characteristics further include specifying information concerning the channels 1–21, which may include identifying a capacity for each of the channels 1–21, which reflects the number of wires 41 that may be formed in a specified one of the channels 1–21. The channels 1–21 may be further specified by assigning a weight to each of the channels 1–21, which reflects the length of the selected one of the channels 1–21, or alternatively, reflects the delay time associated with a selected one of the channels 1–21. Still further, the known topological characteristics requiring codification include a description of the net lengths to be balanced. Accordingly, one of the pins 0'–8' is specified as an origin, and another one of the pins 0'–8' is selected as a destination. In addition, since the required nets may be coupled to different ones of the cells 32–38, a group may also be specified for each of the nets in the device 30.

Still referring to FIG. 2, at step 44, an initial population of netlists is generated. The initial population may be comprised of a predetermined set of netlists that minimize the net lengths coupling the cells 32–38. Alternatively, the initial population may be less rigorously defined. For example, the initial population may be generated by netlists that each have initial approximate estimations for the matched nets. Still further, the initial population may be comprised of a series of netlists that are generated by a mutation operator, as will be described in greater detail below. Alternatively, the initial population may be randomly generated, and may be of any size, with larger population sizes generally yielding a larger proportion of netlists of better fitness, while incurring more computational time, as will be described more fully below.

At step 46, parents are selected from the initial population for crossover and/or mutation. The selection of parents begins by evaluating each of the netlists constituting the initial population with an evaluation function that embodies the constraints of the problem, and generates a numerical fitness value corresponding to each evaluated netlist. In the present case, an evaluation function was developed that satisfied three principal objectives related to the development of a balanced netlist for the device 30. First, nets stemming from common pins must be balanced. Secondly, nets within the same group must be balanced, regardless of the originating pin. Third, the weights associated with the nets should be minimized where possible.

An evaluation function that embodies the foregoing objectives is given by the following expression (1):

$$F=(C_s \times B_s)+(C_g \times B_g)+(C_w \times W_t) \quad (1)$$

In the foregoing evaluation function (1), F represents a fitness value for a particular solution, $B_s$ and $B_g$ are balance factors corresponding to nets sharing a common source and a common group, respectively. The coefficients $C_s$, $C_g$ and $C_w$ have values that may be independently adjusted to control the contribution of $B_s$, $B_g$ and $W_t$, respectively. In one particular embodiment, $C_s$ and $C_g$ may equal approximately about 2, and $C_w$ may equal approximately about ½. The balance factor $B_s$ may be calculated by subtracting the minimum weight from the maximum weight for the common source nets. Similarly, the balance factor $B_g$ may be calculated by subtracting the minimum weight from the maximum weight for the common group nets. The weights for the common source nets and the common group nets is obtained from the information compiled at step 42. The coefficient $W_t$ is the sum of all the net weights, and is similarly obtainable from the information compiled at step 42. When a fitness value is calculated using the evaluation function (1), a number of generally lower absolute value results from the generally fitter solutions (or netlists), while a number of generally higher absolute value results from a less fit solution.

Referring still to FIG. 2, and to step 46 in particular, following the determination of fitness values for each individual in the initial population, the selection of parents proceeds by subjecting the initial population to a tournament selection procedure that identifies the two fittest individuals in the population. Thus, the more fit solutions (having generally lower absolute values for fitness) are selected as parents.

At step 47, the parents are combined to yield offspring. A random number $N_r$ between 0 and 1 is determined for each pair of parents, which is compared to a preselected crossover probability $P_c$. The random number generation may include any random number generation method known to those skilled in the art. If the random number $N_r$ is less than $P_c$, crossover occurs. If $N_r$ is greater than $P_c$, no crossover occurs, and the parents do not produce offspring. In one particular embodiment, the crossover probability $P_c$ is approximately about 0.8, although other values may be used. When crossover occurs, a first net is randomly selected from each of the parents. The randomly selected nets are then swapped and combined with the remaining nets for each of the parents to yield a single offspring derived from each parent. Thus, the number of offspring derived from the parents equals the number of parents.

At step 48, the offspring or alternatively, the selected parents if no crossover occurs, may be mutated to introduce a random change into the offspring. Mutation of the offspring occurs by generating another random number $N_r$ at step 48. Again, a comparison between the random number generated and a predetermined mutation probability $P_m$ occurs. Thus, if $N_r$ is less than the mutation probability $P_m$, mutation occurs. If, however, $N_r$ is greater than the mutation probability $P_m$, no mutation occurs. In a particular embodiment, the mutation probability $P_m$ is approximately about 0.2, although other values may also be used. The mutation procedure will be described in greater detail in connection with another figure.

Referring now to step 50, the fitness of the offspring and/or mutated parents are evaluated according to the evaluation function (1) described in connection with step 46. Accordingly, fitness values associated with each offspring and/or mutated parent solution are generated. Presumably, the offspring and/or mutations possess fitness values that are generally lower than the fitness values corresponding to many of the individuals in the population, so that the solutions thus generated are retained in the population, while less fit solutions are discarded. In general, the number of individuals comprising the population of netlists will be maintained at a constant value, which may require that the more fit solutions in the population be included in the population multiple times.

At step 52, the method 40 tests for convergence of the netlist solutions. Convergence may be indicated by when the difference between the least fit solutions and the most fit solutions is less than, or equivalent to a predetermined convergence criterion. Alternatively, other convergence criteria may be applied. For example, convergence may also be indicated by determining a maximum number of generations, and interrupting the execution of the algorithm when the specified number of generations has been calculated. Still further, convergence may also be determined by retaining the solution that yields the best overall fitness value while the algorithm is proceeding, and terminating the procedure after a predetermined number of generations has been calculated, so that a solution is obtained even if the algorithm is unstable and diverges. In any case, if convergence is not attained at step 52, the offspring are included in successive parent populations, and the method 40 repeats the steps 46–52.

Figure 3:
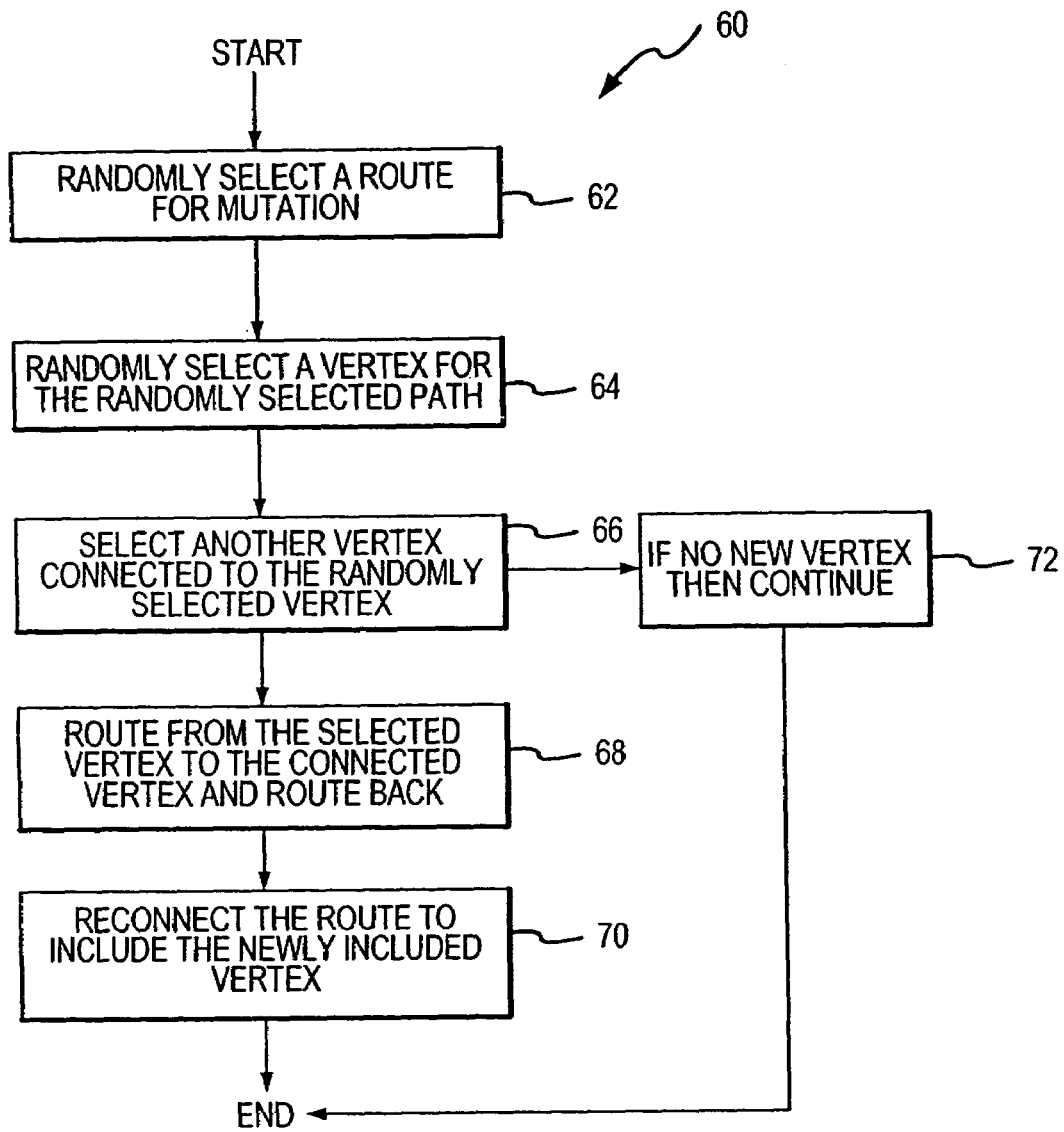
FIG. 3 is a flowchart illustrating the steps in a method for mutating selected individuals in a population of netlists, according to another embodiment of the invention.

With reference now to FIG. 3 a method 60 for mutating selected individuals in a population of netlists is shown, according to another embodiment of the invention. With reference now to step 62, the method randomly selects one or more nets within an individual in the population for mutation. The random selection may include any random selection technique known to those skilled in the art. For the randomly selected net, a vertex along the net is randomly selected, as shown in step 64. For the randomly selected net and the randomly selected vertex along the net, another vertex is selected that is connected to the randomly selected vertex, as shown in step 66. If there is no vertex that is connected to the randomly selected vertex, the randomly selected net is not mutated, and the method is terminated at step 72. Otherwise, the randomly selected net is mutated by routing from the randomly selected vertex to the vertex selected in step 66, and routing back, as shown in step 68. The additional routing determined in step 68 is then reconnected to the randomly selected net. Since mutation may be used to contribute random variations to selected individuals in the population, it is an important adjunct to crossover, in that it constitutes a mechanism to introduce diversity into a population.

The mutation method 60 may also be employed to generate an initial population of netlists, as previously discussed in connection with step 44 of FIG. 2 In generating the initial population, a single net assigned to a single individual is successively mutated using a mutation probability $P_m$ of 1.0, which forces mutation to occur in each successive step. The mutation continues until the desired initial population size is generated. The single net used to start the mutation procedure may be obtained from a minimum net length solution, or alternatively, a manually derived solution may also be used.

The foregoing embodiments advantageously permit a matched netlist solution to be rapidly and efficiently developed, thus permitting the development of microelectronic devices exhibiting enhanced levels of performance. The present embodiments greatly simplify the determination of matched net lengths by advantageously decoupling net routing creation from net route optimization, since the embodiments of the present invention begin with an unbalanced netlist solution and rapidly transform net routing into a matched netlist solution. As a result, the foregoing embodiments do not generally require the integration of other prior art computational net routers to simultaneously generate a net routing solution while the matched net length solution is being generated.

Figure 4:
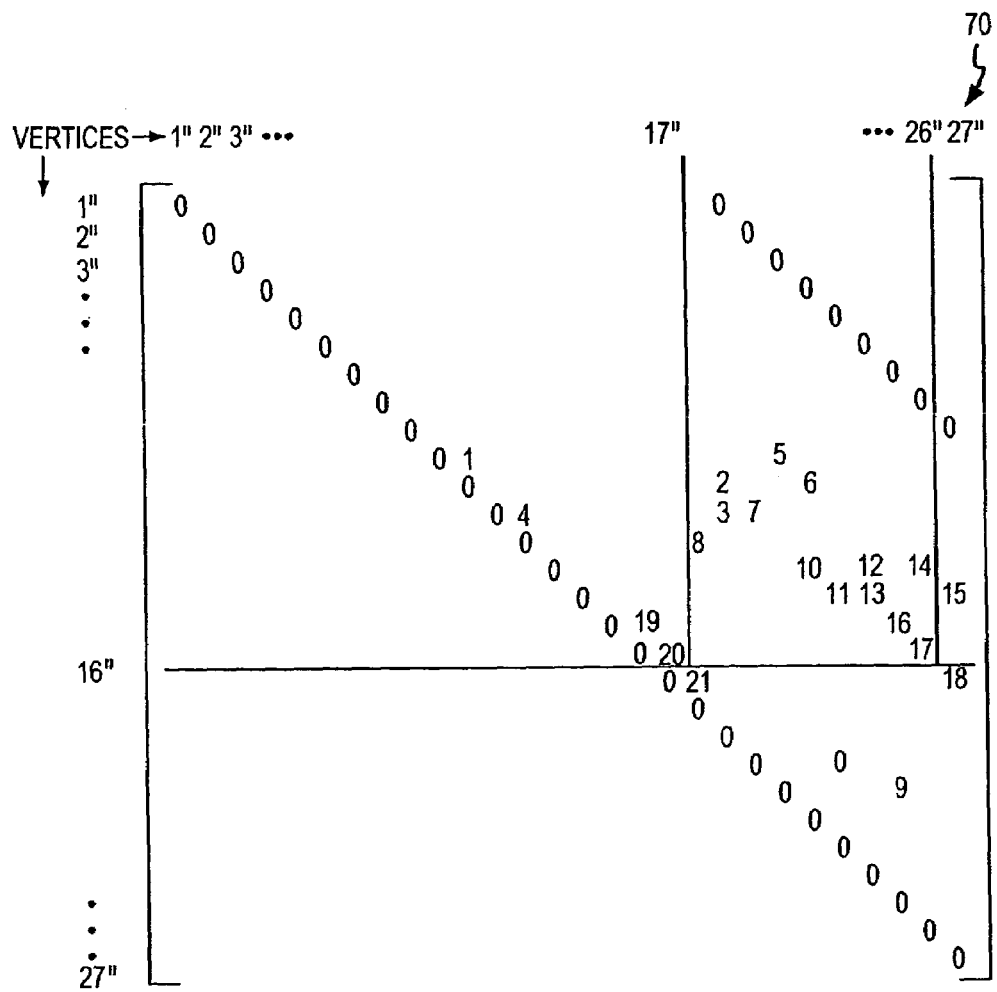
FIG. 4 is a vertex matrix corresponding to an exemplary microelectronic device.

Referring now to FIGS. 4 through 8, the foregoing embodiments will be used to generate a matched netlist solution for a microelectronic device. In this exemplary case, the embodiments of the present invention will be applied to the microelectronic device 30 shown in FIG. 1. In the following description, it is understood that the description of the embodiments as applied to the present example are not intended to limit the scope of the present invention. Instead the following discussion and figures are offered to permit one skilled in the art to better understand the various embodiments of the present invention FIG. 4 shows a vertex matrix 70 for the microelectronic device 30 of FIG. 1. The matrix 70 describes how the plurality of vertices 1"–27" are coupled. Since each one of the vertices 1"–27" is coupled to itself, this coupling is arbitrarily assigned to a channel 0, so that a plurality of zeros are positioned along the principal diagonal of the matrix 70. Further, channel 0 is used to describe the coupling of pins 0'–8' to adjacent ones of the vertices 1"–27". For example, and with reference now to FIG. 1, the vertices 19"–22' are directly coupled to the pins 0'–3', so that another plurality of zeros is positioned along a minor diagonal of the matrix 70. Other entries indicate selected ones of the vertices 1"–27" that are coupled by selected channels 1–21. For example, and with reference again to FIG. 1, vertex 16" is coupled to vertex 17" by channel 20. Accordingly, channel 20 is positioned at row 16 and column 17 of the matrix 70. In addition, vertex 16" is coupled to vertex 26" by channel 17. Therefore channel 17 is positioned at row 16 and column 26 of the matrix 70. Other ones of the channels 1–21 may be positioned within the matrix 70 in the foregoing manner. Although the matrix 70 describes the interconnections between the vertices 1"–27", it does not describe the capacity of each of the channels 1–21, or the weight associated with each of the channels 1–21.

FIG. 5 shows a channel table 80 corresponding to the microelectronic device 30 of FIG. 1. The table 80 includes the capacity values and the weight values corresponding to each of the channels 1–21. As previously described, the capacity of a channel refers to the number of wires that may be formed in a given channel, while the weight of a channel describes the length of the channel, or equivalently, the delay time incurred when a signal is propagated along a wire formed within a channel. The channel values shown in table 80 were obtained by normalizing the channel lengths to obtain the weight values shown therein. In particular, and again with reference to FIG. 1, channel 1 is three units in length, while channel 8 is nine units in length, when properly normalized.

FIG. 6 shows a net table 90 corresponding to the microelectronic device 30 of FIG. 1. The net table 90 embodies the nets that are to be matched. Accordingly, the table 90 represents the routing problem to be solved and includes a list of source pins and drain pins that are to be interconnected by the matched net lengths.

Figure 7:
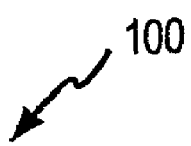
FIG. 7 is an initial netlist solution corresponding to an exemplary microelectronic device.

FIG. 7 shows a netlist solution 100 corresponding to the microelectronic device 30 of FIG. 1. The netlist solution shown in FIG. 7 was obtained from a prior art routing algorithm that determined a minimum net length solution for the device 30, which will be employed as an initial estimate in order to begin the procedure. For comparative purposes, a fitness value was calculated using the evaluation function (1) discussed in connection with FIG. 2. For the minimum net length solution shown in FIG. 7, a fitness value of 75.5 was obtained, which indicates that the nets are relatively poorly matched, as expected. As previously described, an initial population may be generated from the minimum net length solution by repetitively mutating the solution using the mutation method 60 shown in FIG. 3 in order to generate an initial population of a predetermined size.

FIG. 8 shows the results of a crossover as applied to parents $P_1$ and $P_2$. The parents $P_1$ and $P_2$ were obtained from the initial net solution 100 of FIG. 7 by mutating the net 100 using the mutation method 60 of FIG. 3, where the mutation probability $P_m$ was equal to one. Following the generation of the initial population of netlists, the parents $P_1$ and $P_2$ were selected based upon a determination of the relative fitness values for each of the individuals. In the crossover shown in FIG. 8, the net 0 solution has been selected for crossover. Accordingly, the net 0 solution of offspring $C_1$ includes the net 0 solution from parent $P_2$, and the net 0 solution for the offspring $C_2$ includes the net 0 solution from parent $P_1$, while the remaining nets 1–5 have been passed from the parents $P_1$ and $P_2$ directly to the offspring $C_1$ and $C_2$, respectively. Fitness values were calculated for the offspring $C_1$ and $C_2$ and for the parents $P_1$ and $P_2$, which show that the offspring $C_1$ is fitter than $C_2$ or either of the parents $P_1$ and $P_2$. As a consequence, the offspring $C_1$ may be selected as a member of successive populations of solutions in the method 40 shown in FIG. 2.

Figure 9:
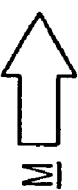
FIG. 9 is a diagram illustrating the results of a mutation corresponding to an exemplary microelectronic device.

FIG. 9 shows the results of a mutation as applied to the offspring solution $C_2$ of FIG. 8. Although the mutation method 60 of FIG. 3 (at step 62) prescribes that a net and a vertex (at step 64) are to be randomly selected for mutation, for purposes of illustration, the net 0 solution and the vertex 23" have been selected for mutation. Accordingly, since the vertex 14" is connected to the vertex 23" a path is routed from vertex 23" to vertex 14" and back to vertex 23", as shown in the net 0 solution of the mutated offspring solution $C_{2M}$. Fitness values were calculated using the evaluation function (1) shown above, which results in a lower fitness value for $C_{2M}$ than the fitness value obtained from $C_2$ indicating that mutation has produced a solution of generally higher fitness.

Figure 10:
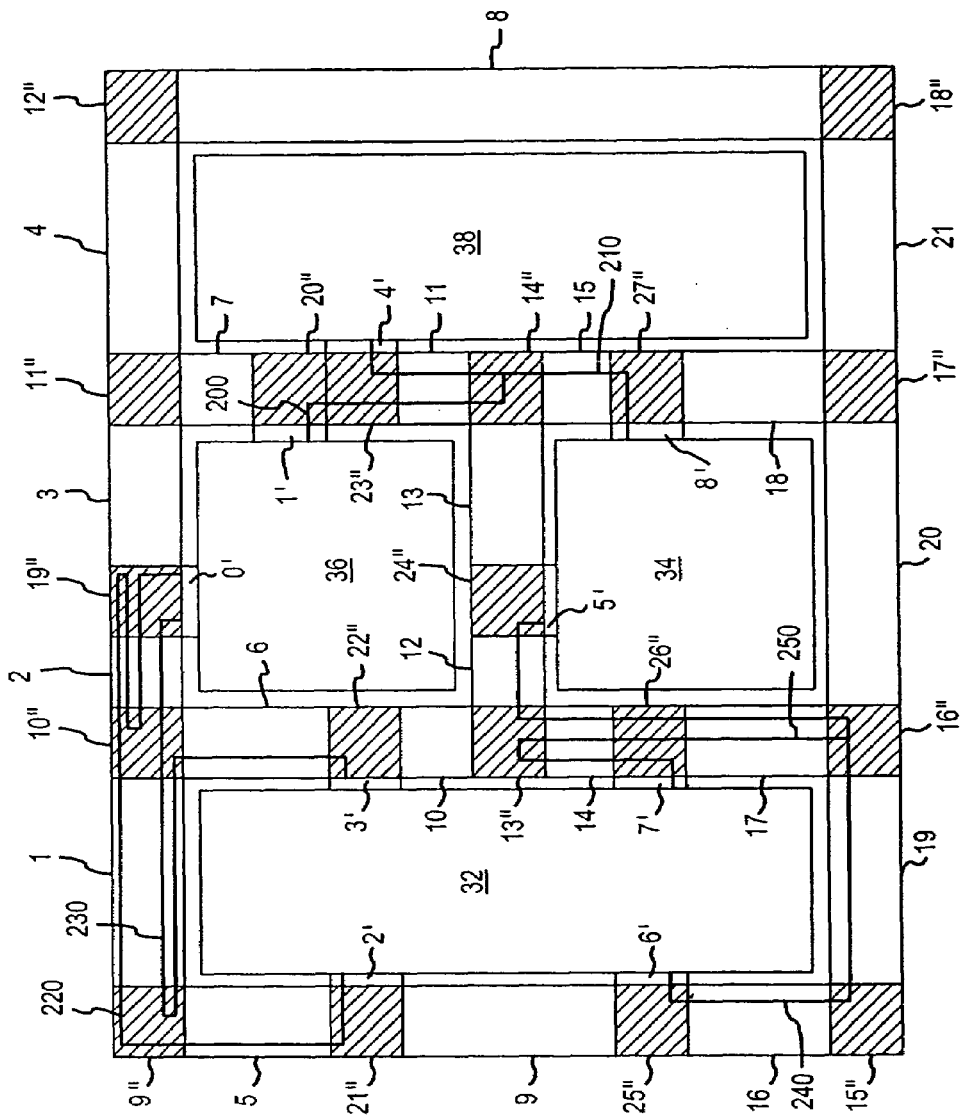
FIG. 10 is a partial plan view of an exemplary microelectronic device with a matched netlist solution positioned thereon.

FIG. 10 is a partial plan view of the microelectronic device 30 of FIG. 1 with the matched netlist solution as described in the foregoing example applied to the device 30. As shown therein, a wire 200 corresponds to the net 0 calculated by the methods 40 and 60 of FIGS. 2 and 3, respectively. A wire 210 similarly corresponds to the net 1 solution. Thus, approximately equivalent signal delays are obtained when signals are propagated between pin 1' of cell 36 and either of pin 4' of cell 38 and pin 8' of cell 34, as desired. Further, a wire 220 corresponds to the net 2, and a wire 230 corresponds to the net 3 to yield approximately equivalent signal delays between the pin 0' of cell 36 and the pins 2' and 3' of cell 32. With regard to wire 220 in particular, it is seen that net 2 solution required the wire 220 to be routed between vertex 19" and vertex 10" through the channel 2 numerous times in order to have the proper length. The number of times a wire may be routed through a channel is governed solely by the capacity of channel, however, since the algorithm as implemented in this example did not rigorously enforce the channel capacity, a channel capacity of four was obtained for the net 2 solution. Algorithms providing rigorous enforcement of a channel capacity requirement may be readily implemented, and are within the scope of the present invention. Finally wires 240 and 250 correspond to the net 4 and the net 5 solutions, and provide signal paths having approximately equivalent signal delays that couple pin 5' of cell 34 to the pins 6' and 7' of cell 32. A fitness value of approximately 38.5 was calculated for the solution shown in FIG. 10.

FIG. 11 shows the results of a computational performance evaluation conducted to investigate the effect of different netlist population sizes. The results in FIG. 11 were obtained for the microelectronic device 30 using a SUN Microsystems SPARCStation 10–250 with 512 MB of RAM installed and using a SUN operating system version 5.7. For the evaluation, netlist population sizes of 25, 50 and 100 were used. As shown in FIG. 11, using a relatively small population of 25, solutions were obtained yielding a fitness value equal to, or less than about 38.5 for about 7% of the population. In contrast, when the population size is doubled to 50, a fitness value equal to, or less than about 38.5 is obtained for about 28% of the population. Still further when the population size was again doubled to 100, a fitness value equal to, or less than about 38.5 is obtained for about 34% of the population. FIG. 11 also shows computational times associated with the populations shown therein. In general, while the larger netlist populations provided a greater percentage of fit solutions, as expected, longer computational times were encountered. It is noted, however, that where the population size is relatively large, for example, equal to 100, the computational time is approximately only about one second.

The above description of illustrated embodiments of the invention is not intended to be exhaustive or to limit the invention to the precise form disclosed. While specific embodiments of, and examples of, the invention are described in the foregoing for illustrative purposes, various equivalent modifications are possible within the scope of the invention as those skilled within the relevant art will recognize. Moreover, the various embodiments described above can be combined to provide further embodiments. Accordingly, the invention is not limited by the disclosure, but instead the scope of the invention is to be determined entirely by the following claims.

The invention claimed is:

1. A method for determining matched netlists for a microelectronic device, comprising:
   compiling a topological plan for the microelectronic device;
   determining nets to be matched in the topological plan
   calculating a first netlist solution corresponding to the topological plan;
   dynamically modifying the first netlist solution using a genetic algorithm to generate a first successive population of second netlist solutions that approach a matched netlist for the device;
   calculating fitness values that indicate how well said nets to be matched are matched in the second netlist solutions from the first successive population; and
   selecting at least one of the second netlist solutions from the first successive population based on how well the fitness value indicates the nets to be matched are matched in the second netlist solutions;
   dynamically modifying a population of the second netlist solutions by applying crossover and mutation to the second netlist solutions to generate a second successive population containing third netlist solutions;
   calculating fitness values for the third netlist solutions from the second successive population; and
   selecting at least one of the third netlist solutions from the second successive population based on how well the fitness values for the third netlist solutions indicates the nets to be matched are matched in the third netlist solutions.

2. The method of claim 1, wherein calculating the fitness values for the netlist solutions comprises forming a sum of a source coefficient multiplied by a source balance factor, a group coefficient multiplied by a group balance factor, and a weight coefficient multiplied by a sum of the routing weights.

3. The method of claim 2, wherein calculating the fitness values further comprises calculating the source balance factor by forming the difference between a maximum weight and a minimum weight for common source nets.

4. The method of claim 2, wherein calculating the fitness values further comprises calculating the group balance factor by forming the difference between a maximum weight and a minimum weight for common group nets.

5. The method of claim 2, wherein calculating the fitness values further comprises assigning a value to the source coefficient and the group coefficient of approximately about two.

6. The method of claim 2, wherein calculating the fitness values further comprises assigning a value to the weight coefficient of approximately about one-half.

7. The method of claim 1, further including, establishing an initial population of first netlists by successively mutating the first established netlist to obtain the initial population and dynamically modifying the first netlist includes dynamically modifying the population of first netlists.

8. The method of claim 1, wherein calculating the first netlist solution comprises calculating a population of minimum length netlists corresponding to the plan.

9. The method of claim 1, wherein dynamically modifying the population of the second netlist solutions further comprises:
associating a randomly generated number with the second netlist solutions;
comparing the number with a preselected crossover probability; and
performing the crossover based on the comparison.

10. The method of claim 1, wherein dynamically modifying the population of the second netlist solutions further comprises:
associating a randomly generated number with the second netlist solutions;
comparing the number with a preselected mutation probability; and
performing the mutation based on the comparison.

11. The method of claim 1, wherein compiling a topological plan comprises:
identifying cells within the device and pins coupled to the cells;
providing a description of the vertices to be coupled;
describing the channels extending between the vertices; and
specifying the nets that are to be matched.

12. The method of claim 11, wherein providing a description of the vertices to be coupled further comprises compiling a vertex matrix for the device.

13. The method of claim 11, wherein describing the channels extending between the vertices further comprises compiling a channel table for the device.

14. The method of claim 11, wherein specifying the nets that are to be matched further comprises compiling a route table for the device.

15. A method for generating a matched netlist for a microelectronic device, comprising:
generating a first population of netlists for the device;
evaluating the generated netlists according to a predetermined fitness criterion that determines how well nets to be matched are matched in the first population of netlists and generating a fitness value for each netlist based upon the evaluation;
comparing the fitness values and selecting a pair of netlists based on the comparison; and
performing a crossover of the pair of selected netlists to generate a pair of offspring netlists; and
performing a mutation of at least one of the offspring netlists;
wherein evaluating the netlists according to a predetermined fitness criterion further comprises calculating the fitness value by forming a sum of a source coefficient multiplied by a source balance factor, a group coefficient multiplied by a group balance factor, and a weight coefficient multiplied by a sum of the routing weights.

16. The method of claim 15, wherein calculating the fitness value further comprises calculating the source balance factor by forming a difference between a maximum weight and a minimum weight for common source routes.

17. The method of claim 15, wherein calculating the fitness value further comprises calculating the group balance factor by forming a difference between a maximum weight and a minimum weight for common group routes.

18. The method of claim 15, wherein calculating the fitness value further comprises assigning a value to the source coefficient and the group coefficient of at least about two.

19. The method of claim 15, wherein calculating the fitness value further comprises assigning a value to the weight coefficient of at least about one-half.

20. The method of claim 15, wherein comparing the fitness values and selecting at least two netlists further includes selecting the pair of netlists using a tournament selection procedure.

21. A method for generating a matched netlist for a microelectronic device, comprising:
generating a first population of netlists for the device;
evaluating the generated netlists according to a predetermined fitness criterion that determines how well nets to be matched are matched in the first population of netlists and generating a fitness value for each netlist based upon the evaluation;
comparing the fitness values and selecting a pair of netlists based on the comparison;
performing a crossover of the pair of selected netlists to generate a pair of offspring netlists; and
performing a mutation of at least one of the offspring netlists;
wherein performing a crossover of the pair of netlists further comprises: selecting a net from a first one of the pair of netlists by a random selection process; and
selecting a net from a second one of the pair of netlists by a random selection process;
interchanging the net from the first one of the pair of netlists and the net from the second one of the pair of netlists to obtain a pair of offspring netlists.

22. The method of claim 21, further comprising generating a random number and comparing the random number to a predetermined crossover probability and performing the crossover based upon the comparison.

23. The method of claim 22, wherein generating a random number and comparing the random number to a predetermined crossover probability further comprises comparing the random number to a crossover probability of approximately about 0.8.

24. A method for generating a matched netlist for a microelectronic device, comprising:
generating a first population of netlists for the device;
evaluating the generated netlists according to a predetermined fitness criterion that determines how well nets to be matched are matched in the first population of netlists and generating a fitness value for each netlist based upon the evaluation;
comparing the fitness values and selecting a pair of netlists based on the comparison; and
performing a crossover of the pair of selected netlists to generate a pair of offspring netlists; and
performing a mutation of at least one of the offspring netlists;

wherein performing a mutation of at least one of the offspring netlists further comprises:
selecting a net from a first one of the pair of netlists by a random selection process;
selecting a first vertex in the selected net by a random selection process;
selecting a second vertex in the selected net by a random selection process;
adding a segment length that extends from the first vertex to the second vertex and recursively extends to the first vertex; and
including the segment length to the selected net.

25. The method of claim 24, further comprising generating a random number and comparing the random number to a predetermined mutation probability and performing the mutation based upon the comparison.

26. The method of claim 25, wherein generating a random number and comparing the random number to a predetermined mutation probability further comprises comparing the random number to a crossover probability of approximately about 0.2.

* * * * *